US010504935B2

(12) United States Patent
Cho et al.

(10) Patent No.: US 10,504,935 B2
(45) Date of Patent: Dec. 10, 2019

(54) ORGANIC LIGHT EMITTING DISPLAY DEVICE

(71) Applicant: LG Display Co., Ltd., Seoul (KR)

(72) Inventors: Woo-Chan Cho, Paju-si (KR); Ho-Young Jeong, Goyang-si (KR); Yong-Min Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 51 days.

(21) Appl. No.: 15/825,445

(22) Filed: Nov. 29, 2017

(65) Prior Publication Data
US 2018/0151599 A1 May 31, 2018

(30) Foreign Application Priority Data

Nov. 30, 2016 (KR) ........................ 10-2016-0161362

(51) Int. Cl.
| | |
|---|---|
| *H01L 27/32* | (2006.01) |
| *H01L 27/12* | (2006.01) |
| *H01L 51/52* | (2006.01) |
| *G09G 3/3241* | (2016.01) |
| *H01L 51/56* | (2006.01) |
| *G09G 3/3233* | (2016.01) |

(52) U.S. Cl.
CPC ...... *H01L 27/1244* (2013.01); *H01L 27/3276* (2013.01); *H01L 51/5203* (2013.01); *G09G 3/3233* (2013.01); *G09G 3/3241* (2013.01); *G09G 2320/0295* (2013.01); *G09G 2320/043* (2013.01); *H01L 27/3246* (2013.01); *H01L 27/3248* (2013.01); *H01L 51/56* (2013.01)

(58) Field of Classification Search
CPC ............. H01L 27/1244; H01L 27/3276; H01L 27/3246; H01L 27/3248
See application file for complete search history.

(56) References Cited

U.S. PATENT DOCUMENTS

| | | | | |
|---|---|---|---|---|
| 2010/0019996 | A1* | 1/2010 | You | ..................... H01L 27/1214 345/76 |
| 2017/0168612 | A1* | 6/2017 | Lee | ......................... G06F 3/044 |
| 2017/0294464 | A1* | 10/2017 | Kwon | ............... H01L 29/78606 |
| 2017/0345846 | A1* | 11/2017 | Yang | ................... H01L 27/1244 |
| 2018/0083085 | A1* | 3/2018 | Moon | ................. H01L 27/3246 |

* cited by examiner

Primary Examiner — Douglas M Menz
(74) Attorney, Agent, or Firm — Morgan, Lewis & Bockius LLP

(57) ABSTRACT

An organic light emitting display device is disclosed. The organic light emitting display device includes a light emitting element disposed in each sub-pixel area on a substrate; a pixel circuit disposed in a circuit area of each sub-pixel area to drive the light emitting element; a first signal line disposed on the substrate to contact the substrate, arranged in a first direction, and connected to the pixel circuit; a second signal line arranged in a second direction and connected to the pixel circuit; and at least two insulation films disposed between the first and second signal lines.

17 Claims, 14 Drawing Sheets

ORGANIC LIGHT EMITTING DISPLAY DEVICE

This application claims the benefit of Korean Patent Application No. 10-2016-0161362, filed on Nov. 30, 2016, which is hereby incorporated by reference as if fully set forth herein.

BACKGROUND

Technical Field

The present invention relates to an organic light emitting display device. More particularly, the present invention relates to an organic light emitting display device to prevent short-circuit defects of signal lines.

Discussion of the Related Art

Image display devices for displaying a variety of information on a screen are significant technologies in the information-technology era and are being developed into slimmer, lighter weight, more portable and higher-functional forms. In response to these requirements, organic light emitting diodes that display an image by controlling the amount of light emitted by an organic light emitting layer attract a great deal of attention as flat panel display devices capable of reducing weight and volume, which are drawbacks of cathode ray tubes. Organic light emitting diodes (OLEDs), which spontaneously emit light, have low power consumption, rapid response speed, high luminous efficacy, high brightness and wide viewing angle.

Organic light emitting diodes display an image through a plurality of pixels disposed in the form of a matrix. Each pixel includes a light emitting element and a pixel circuit which independently operates the light emitting element and includes a plurality of transistors.

The organic light emitting display device includes first and second signal lines L1 and L2 which supply different driving signals to a pixel circuit. As shown in FIG. 1, the first signal line L1 is formed on a lower insulation film 2 disposed on a substrate 1 and the second signal line L2 is formed on an upper insulation film 4 covering the first signal line L1. In this case, foreign matter is often created during the manufacturing process between the first and second signal lines L1 and L2, or under the first signal line L1. In this case, the foreign matter reduces the distance between the first and second signal lines L1 and L2, thus disadvantageously causing short-circuits between the first and second signal lines L1 and L2.

In addition, the first and second signal lines L1 and L2 alternate such that a single layer of upper insulation film 4 is interposed therebetween, thus having problems of high parasitic capacitance as well as high possibility of causing short-circuit defects due to relatively small distance between the first and second signal lines L1 and L2.

SUMMARY

Accordingly, embodiments of the present disclosure are directed to an organic light emitting display device that substantially obviates one or more problems due to limitations and disadvantages of the related art.

An aspect of the present disclosure is to provide an organic light emitting display device to prevent short-circuit defects of signal lines.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device can prevent short-circuit defects between first and second signal lines by forming the first signal line including a scan line and a sensing control line disposed in a horizontal direction on a substrate such that the first signal line contacts the substrate, and forming the second signal line including a data line, a high-voltage supply line and a low-voltage supply line disposed in a vertical direction on at least two insulation films which cover the first signal line.

In one aspect, an organic light emitting display device comprises: a light emitting element disposed in each sub-pixel area on a substrate; a pixel circuit disposed in a circuit area of each sub-pixel area to drive the light emitting element; a first signal line disposed on the substrate to contact the substrate, arranged in a first direction, and connected to the pixel circuit; a second signal line arranged in a second direction and connected to the pixel circuit; and at least two insulation films disposed between the first and second signal lines.

In another aspect, an organic light emitting display device comprises: a scan line and a sensing control line disposed in a horizontal direction on a substrate such that the scan line and the sensing control line contact the substrate; at least two insulation films disposed on the scan line and the sensing control line; a data line, a high-voltage supply line and a low-voltage supply line disposed in a vertical direction on the insulation films; a pixel circuit connected to the scan line, the sensing control line, the data line, the high-voltage supply line and the low-voltage supply line; and a light emitting element connected to the pixel circuit.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the present invention, examples of which are illustrated in the accompanying drawings.

Figure 1:
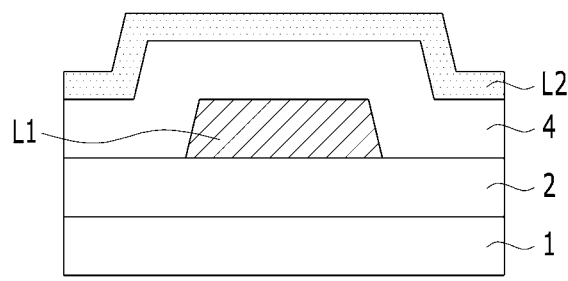
FIG. 1 is a sectional view illustrating location relation between signal lines of an organic light emitting display device according to the related art.
Figure 2:
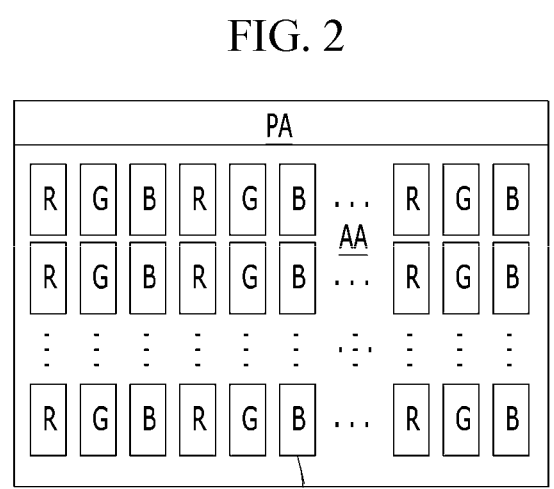
FIG. 2 shows an organic light emitting display device according to the present invention.
Figure 2:
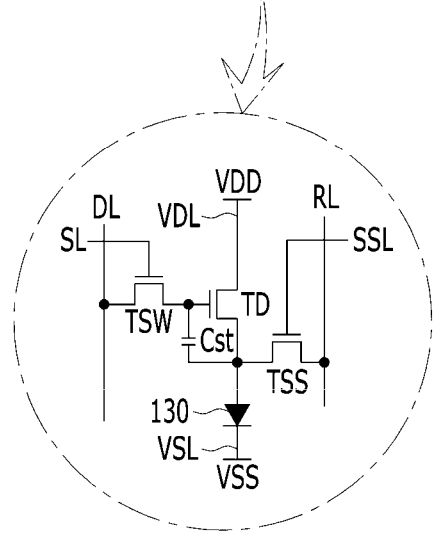

FIG. 2 is a plan view illustrating an organic light emitting display device according to the present invention.

The organic light emitting display device according to the present invention shown in FIG. 2 includes an active area AA and a pad area PA.

In the pad area PA, a plurality of pads, which each supply a driving signal to a scan line SL, a sensing control line SSL, a data line DL, a reference line RL, a high-voltage VDD supply line VDL and a low-voltage VSS supply line VSL disposed in the active area AA, are formed.

The active area AA displays an image through a unit pixel including a light emitting element 130. The unit pixel includes red R, green G and blue B sub-pixels, or red R, green G, blue B and white W sub-pixels. Each of the sub-pixels (or each sub-pixel area) includes the light emitting element 130 and a pixel driving circuit independently operating the light emitting element.

The pixel driving circuit is disposed in a circuit area of each sub-pixel area and includes a switching thin film transistor (or a switching transistor) TSW, a driving thin film transistor (or a driving transistor) TD, a sensing thin film transistor (or a sensing transistor) TSS and a storage capacitor Cst.

Figure 3:
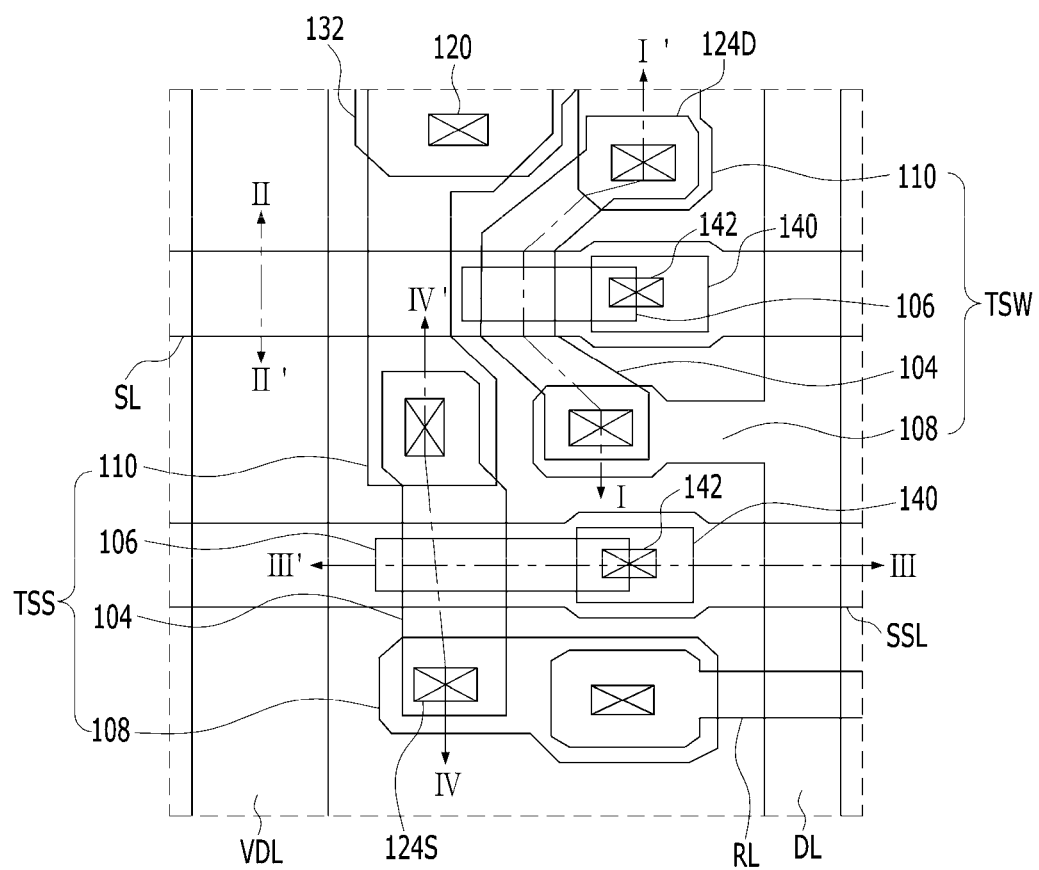
FIG. 3 is a plan view illustrating, in detail, a switching transistor and a sensing transistor of the organic light emitting display device shown in FIG. 2.
Figure 4:
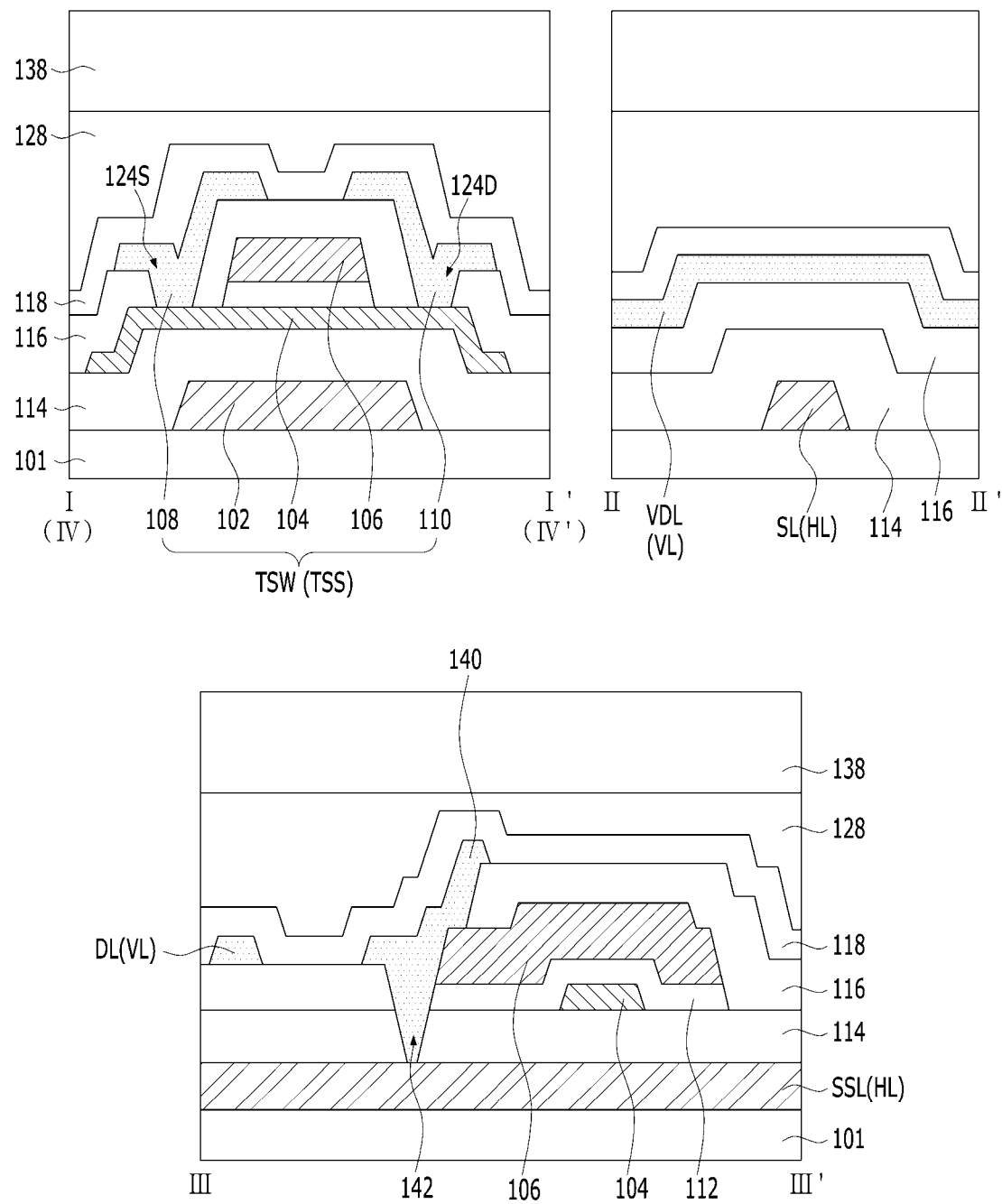
FIG. 4 is a sectional view taken along lines "I-I", "II-II", "III-III" and "IV-IV" of the organic light emitting display device shown in FIG. 3.

When a scan pulse is supplied to a scan line SL, the switching thin film transistor TSW is turned on and supplies a data signal supplied to the data line DL to the storage capacitor Cst and a gate electrode of the driving thin film transistor TD. For this purpose, as shown in FIGS. 3 and 4, the switching thin film transistor TSW includes a gate electrode 106 connected to the scan line SL, a source electrode 108 connected to the data line DL, a drain electrode 110 connected to the gate electrode of the driving thin film transistor TD, and an active layer 104 forming a channel between source and drain electrodes 108 and 110 of the switching thin film transistor TSW.

The driving thin film transistor TD controls the current supplied from the high-voltage supply line VDL according to the driving voltage charged in the storage capacitor Cst and supplies a current in proportion to the driving voltage to the light emitting element 130, thereby leading to light emission of the light emitting element 130. For this purpose, the driving thin film transistor TD includes a gate electrode connected to a drain electrode of the switching thin film transistor TSW, a source electrode connected to the high-voltage supply line VDL, a drain electrode connected to the light emitting element 130 and an active layer forming a channel between the source and drain electrodes of the driving thin film transistor TD.

When a sensing pulse is supplied to the sensing control line SSL, the sensing thin film transistor TSS is turned on and detects a threshold voltage of the driving thin film transistor TD. That is, when the sensing thin film transistor TSS is turned on, a current pass to the sensing thin film transistor TSS and the reference line RL is created. A data driver (not shown) or a timing controller (not shown) detects a current flowing through the current pass, thereby detecting the threshold voltage of the driving thin film transistor TD and the threshold voltage of the light emitting element 130. Based on the detected threshold voltage, a data voltage is compensated and the compensated data voltage is supplied to the data line DL. For this purpose, the sensing thin film transistor TSS includes a gate electrode 106 connected to the sensing control line SSL, a source electrode 108 connected to the reference line RL, a drain electrode 110 connected to the driving thin film transistor TD and an active layer 104 forming a channel between the source and drain electrodes 108 and 110 of the sensing thin film transistor TSS.

The respective gate electrodes 106 of the switching thin film transistor TSW and the sensing thin film transistor TSS overlap the respective active layers 104 via a gate insulation pattern 112 which is the same pattern as the gate electrodes 106. As shown in FIG. 3, the gate electrode 106 of the switching thin film transistor TSW is connected through a connection electrode 140 to the scan line SL exposed through the gate contact hole 142. In addition, as shown in FIG. 4, the gate electrode 106 of the sensing thin film transistor TSS is connected through the connection electrode 140 to the sensing control line SSL exposed through the gate contact hole 142. Here, the gate contact hole 142 penetrates a buffer film 114 and an interlayer insulation film 116 to expose the upper surface of each of the scan line SL and the sensing control line SSL, and the side surface of the gate electrode 106 of each of the switching thin film transistor TSW and the sensing thin film transistor TSS. In addition, the connection electrode 140 is formed on the interlayer insulation film 116 using the same material as those of the data line DL, and the source and drain electrodes 108 and 110.

The active layer 104 of each of the switching thin film transistor TSW and the sensing thin film transistor TSS overlaps the gate electrode 106 on the gate insulation pattern 112, to form a channel between the source and drain electrodes 108 and 110. The active layer 104 is formed of an oxide semiconductor which includes at least one metal selected from Zn, Cd, Ga, In, Sn, Hf, and Zr, or polycrystalline silicon or amorphous silicon.

The source electrode 108 of each of the switching thin film transistor TSW and the sensing thin film transistor TSS is connected to the active layer 104 through a source contact hole 124S penetrating the interlayer insulation film 116. The drain electrode 110 of each of the switching thin film transistor TSW and the sensing thin film transistor TSS is connected to the active layer 104 through a drain contact hole 124D penetrating the interlayer insulation film 116.

The light emitting element 130 includes an anode 132, a light emitting stack formed on the anode 132 and a cathode formed on the light emitting stack.

The anode 132 is electrically connected to the drain electrode of the driving thin film transistor and the drain electrode of the sensing thin film transistor exposed through the pixel contact hole 120. The anode 132 is exposed by a bank 138 to provide a light emitting region.

The light emitting stack is formed by stacking a hole-related layer, an organic light emitting layer and an electron-related layer in this order or a reverse order on the anode 132. In addition, the light emitting stack may include first and second light emitting stacks which face each other via a charge generation layer. In this case, the organic light emitting layer of at least one of the first and second light emitting stacks generates blue light and the organic light emitting layer of the other of the first and second light emitting stacks generates yellow-green light, thereby generating white light through the first and second light emitting stacks.

The cathode is formed on upper and side surfaces of the light emitting stack and the bank 138 such that the cathode faces the anode 132 via the light emitting stack. The cathode is electrically connected to the low-voltage supply line VSL.

Meanwhile, the first signal line HL of at least one of the scan line SL and the sensing control line SSL according to the present invention is formed in a first direction (for example, a horizontal direction) and the second signal line VL of at least one of the data line DL, the high-voltage supply line VDL and the low-voltage supply line VSL is formed in a second direction (for example, vertical direction) crossing the first direction. The first signal line HL is formed in the same plane (that is, on the substrate 101) using the same material as a light-shielding layer 102. The first signal line HL is disposed on the substrate 101 while contacting the substrate 101, so that foreign matter, which is often created during deposition of an inorganic film (for example, the buffer film 114), is not produced under the first signal line HL. Accordingly, it is possible to protect the first signal line HL from protruding due to the foreign matter, thereby avoiding short-circuit defects between the first and second signal lines HL and VL. On the other hand, a first signal line of the related art disposed on the buffer film involves creation of foreign matter during deposition of the buffer film and therefore protrudes due to the foreign matter, thus causing short-circuit defects between the first and second signal lines.

In addition, the second signal line VL is formed on the same plane (that is, on the interlayer insulation film 116) using the same material as the source and drain electrodes 108 and 110. At least two insulation films including the buffer film 114 and the interlayer insulation film 116 is disposed at the intersection between the first and second signal lines HL and VL. In contrast, one interlayer insulation film of the related art is interposed between the first and second signal lines of the related art. As a result, the distance between the first and second signal lines HL and VL according to the present invention is at least double the distance between the first and second signal lines of the related art, thereby preventing short-circuit between the first and second signal lines HL and VL. Since short-circuit defects between first and second signal lines HL and VL are prevented, the present invention eliminates the necessity of forming a redundant line of the first signal line HL, thus preventing generation of parasitic capacitance between the redundant line and the second signal line VL.

In addition, the present invention can reduce parasitic capacitance between the first and second signal lines HL and VL because the distance between the first and second signal lines HL and VL is increased as compared to the related art.

FIGS. 5A to 5E are sectional views illustrating a method of manufacturing the organic light emitting display device shown in FIG. 4.

Figure 5A:
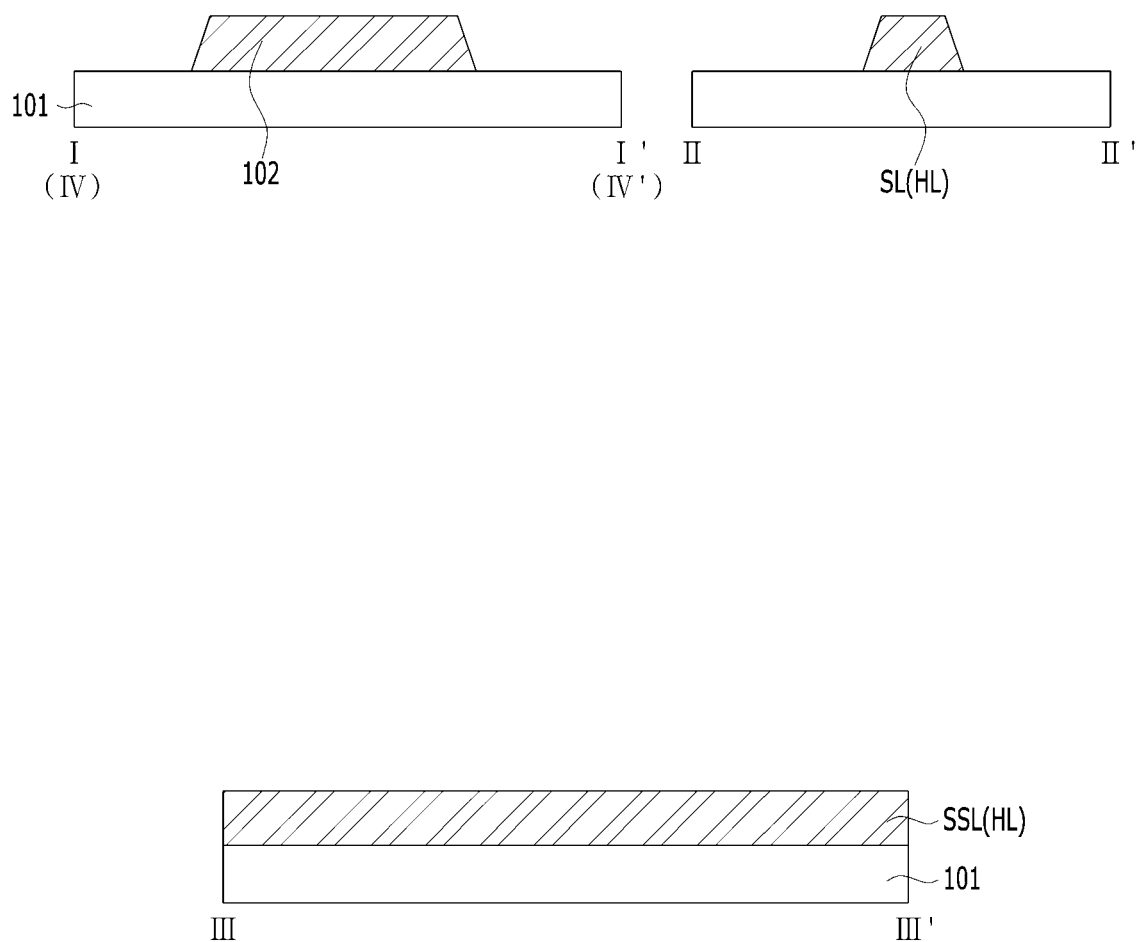
FIGS. 5A to 5E are sectional views illustrating the organic light emitting display device shown in FIG. 4.

Referring to FIG. 5A, a first signal line HL including a scan line SL and a sensing control line SSL, and a light-shielding layer 102 are formed on a substrate 101.

Specifically, a first conductive layer is deposited over the entire surface of the substrate 101 by a deposition method such as sputtering. Here, the first conductive layer is formed as a single layer using a metal material such as Mo, Ti, Cu, AlNd, Al or Cr, or an alloy thereof, or as multiple layers using the same. Then, the first conductive layer is patterned by photolithographic and etching processes to form the first signal line HL including the scan line SL and the sensing control line SSL, and the light-shielding layer 102.

Figure 5B:
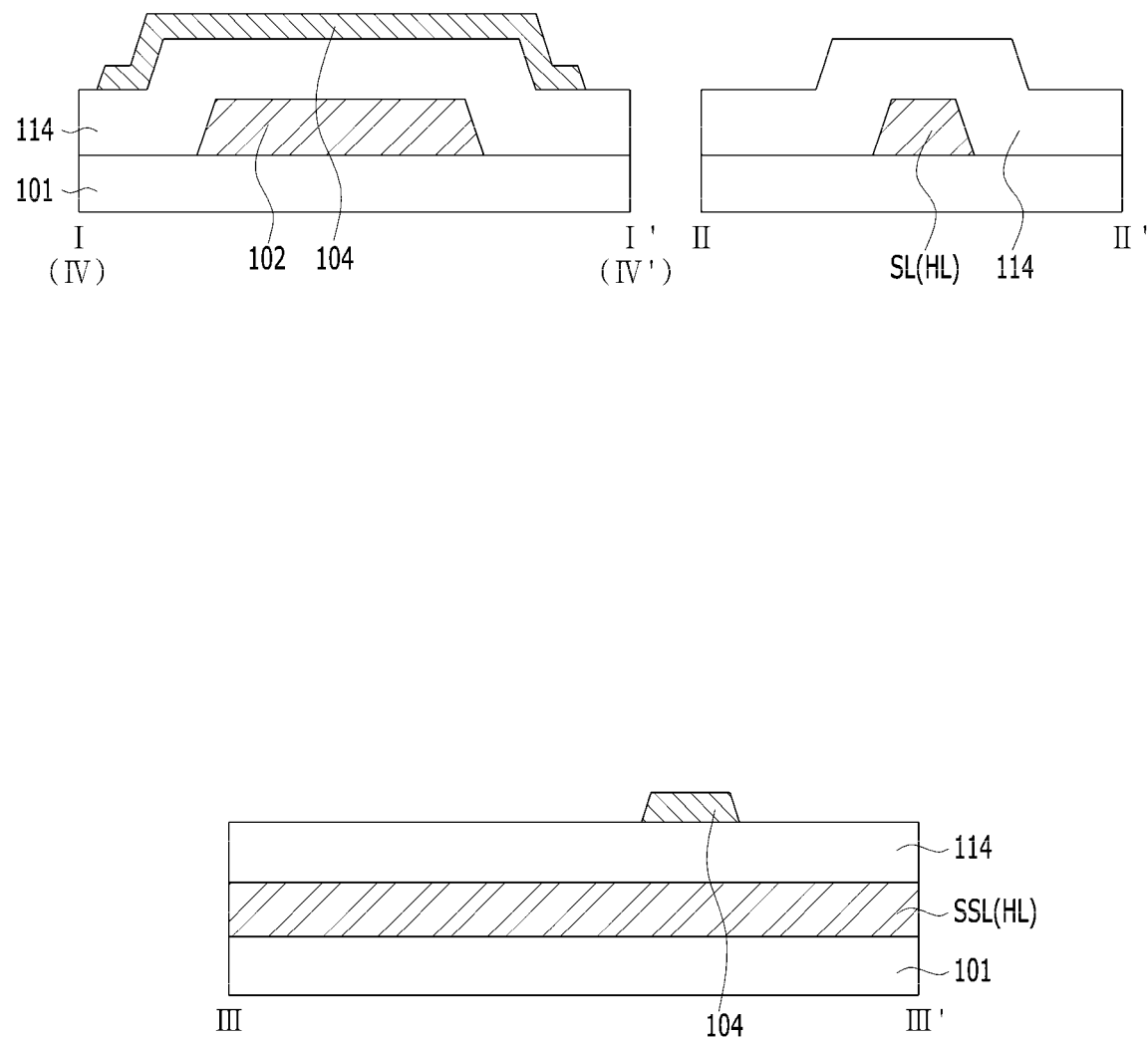

Referring to FIG. 5B, a buffer film 114 is formed on the substrate 101 provided with the first signal line HL and the light-shielding layer 102, and an active layer 104 is formed on the buffer film 114.

More specifically, the buffer film 114 having a single layer or multilayer structure is formed by depositing an inorganic insulation material such as $SiO_x$ or $SiN_x$ over the entire surface of the substrate 101 provided with the first signal line HL and the light-shielding layer 102. Then, an active material is deposited on the substrate 101 provided with the buffer film 114 by a method such as low pressure chemical vapor deposition (LPCVD) or plasma enhanced chemical vapor deposition (PECVD) and then is patterned by photolithography and etching processes to form the active layer 104.

Figure 5C:
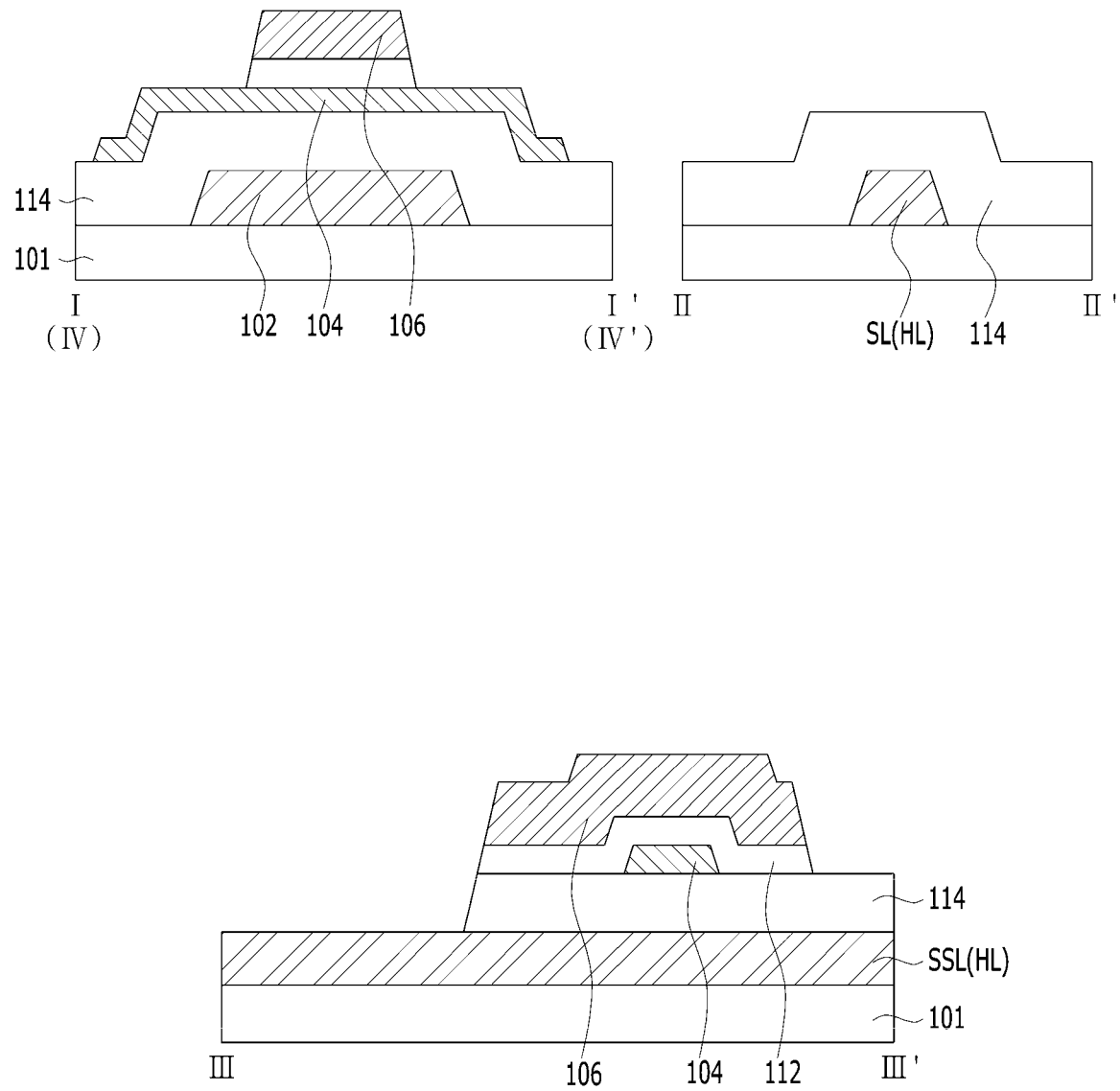

Referring to FIG. 5C, a gate electrode 106 and a gate insulation pattern 112 are formed in the same line width on the substrate 101 provided with the active layer 104.

More specifically, a gate insulation film is formed on the substrate 101 provided with active layer 104 and a second conductive layer is formed thereon by a deposition method such as sputtering. The gate insulation film may be formed using an inorganic insulation material such as $SiO_x$ or $SiN_x$. The second conductive layer is formed as a single layer using a metal material such as Mo, Ti, Cu, AlNd, Al or Cr, or an alloy thereof, or as multiple layers using the same. Then, the second conductive layer and the gate insulation film are simultaneously patterned by a photolithographic process and an etching process to form the gate electrode 106 and the gate insulation pattern 112 in the same line width.

Figure 5D:
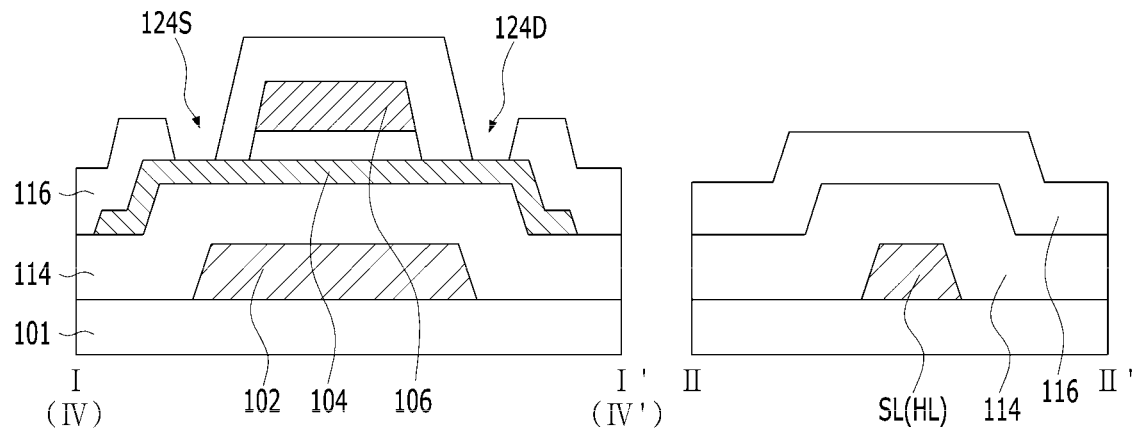
Figure 5D:
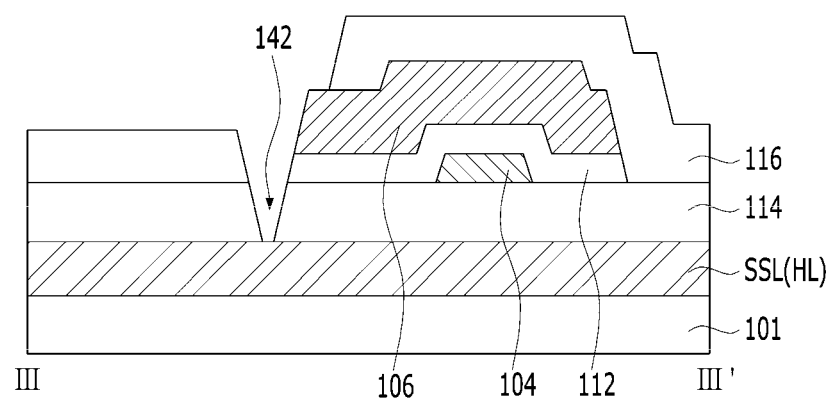

Referring to FIG. 5D, an interlayer insulation film 116 having a source contact hole 124S, a drain contact hole 124D and a gate contact hole 142 is formed on the substrate 101 provided with the gate electrode 106 and the gate insulation pattern 112.

More specifically, the interlayer insulation film 116 is formed by a deposition method such as PECVD on the substrate 101 provided with the gate electrode 106 and the gate insulation pattern 112. Then, the interlayer insulation film 116 is patterned by a photolithographic process and an etching process to form the source contact hole 124S, the drain contact hole 124D and the gate contact hole 142. Here, the source contact hole 124S and the drain contact hole 124D penetrate the interlayer insulation film 116 to expose the active layer 104, and the gate contact hole 142 penetrates the interlayer insulation film 116 and the buffer film 114 to expose the side surface of the gate electrode 106 and the upper surface of the first signal line HL.

Figure 5E:
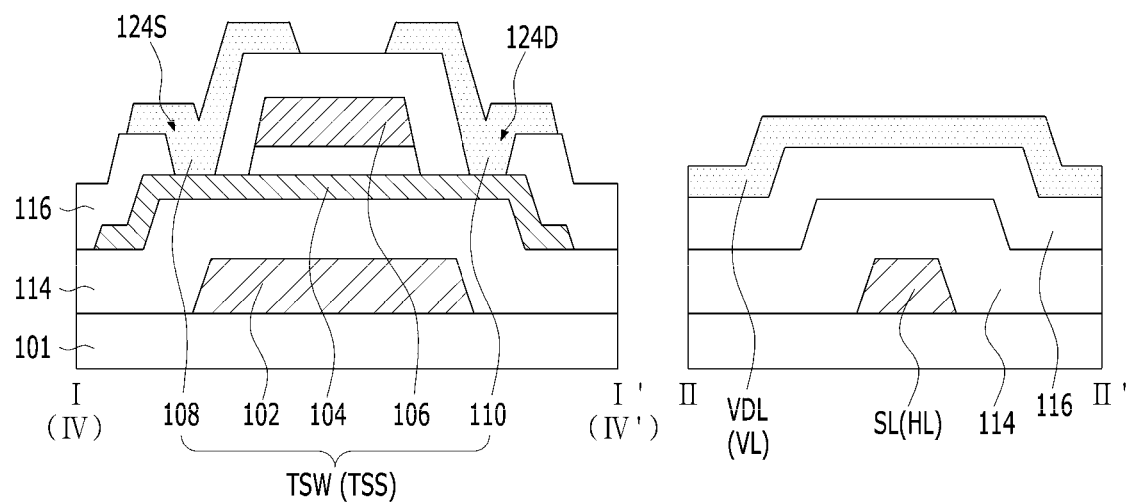
Figure 5E:
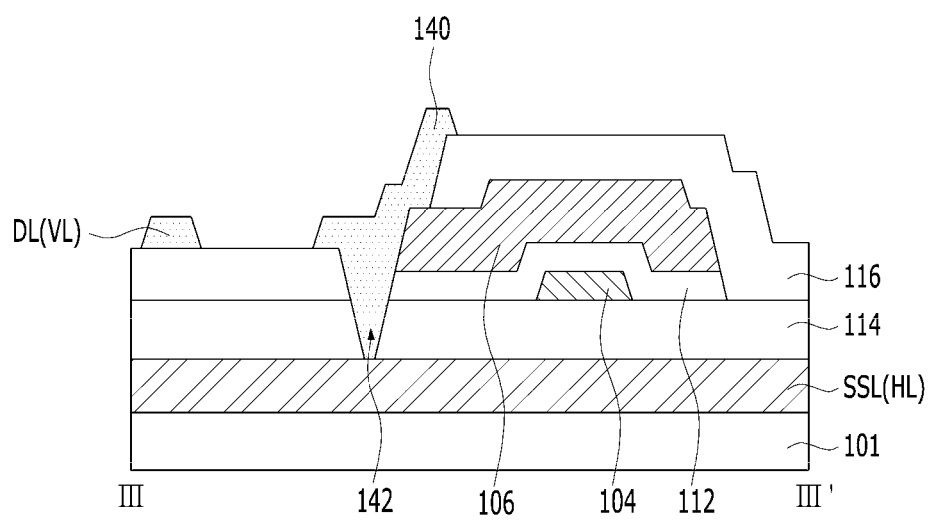

Referring to FIG. 5E, a second signal line VL including a data line DL, a low-voltage supply line VSL and a high-voltage supply line VDL, a source electrode 108, a drain electrode 110 and a connection electrode 140 are formed on the interlayer insulation film 116 provided with the source contact hole 124S, the drain contact hole 124D and the gate contact hole 142.

More specifically, a third conductive layer is formed on the interlayer insulation film 116 provided with the source contact hole 124S, the drain contact hole 124D and the gate contact hole 142 by a deposition method such as sputtering. The third conductive layer is formed as a single layer using a metal material such as Mo, Ti, Cu, AlNd, Al or Cr, or an alloy thereof, or as multiple layers using the same. Then, the third conductive layer is patterned by a photolithographic process and an etching process to form the second signal line VL including the data line DL, the low-voltage supply line VSL and the high-voltage supply line VDL, the source electrode 108, the drain electrode 110 and the connection electrode 140.

Then, a protective film 118, a planarization layer 128, an anode 132, a bank 138, a light emitting stack and a cathode are sequentially formed on the substrate 101 provided with the second signal line VL, the source electrode 108, the drain electrode 110 and the connection electrode 140.

Figure 6:
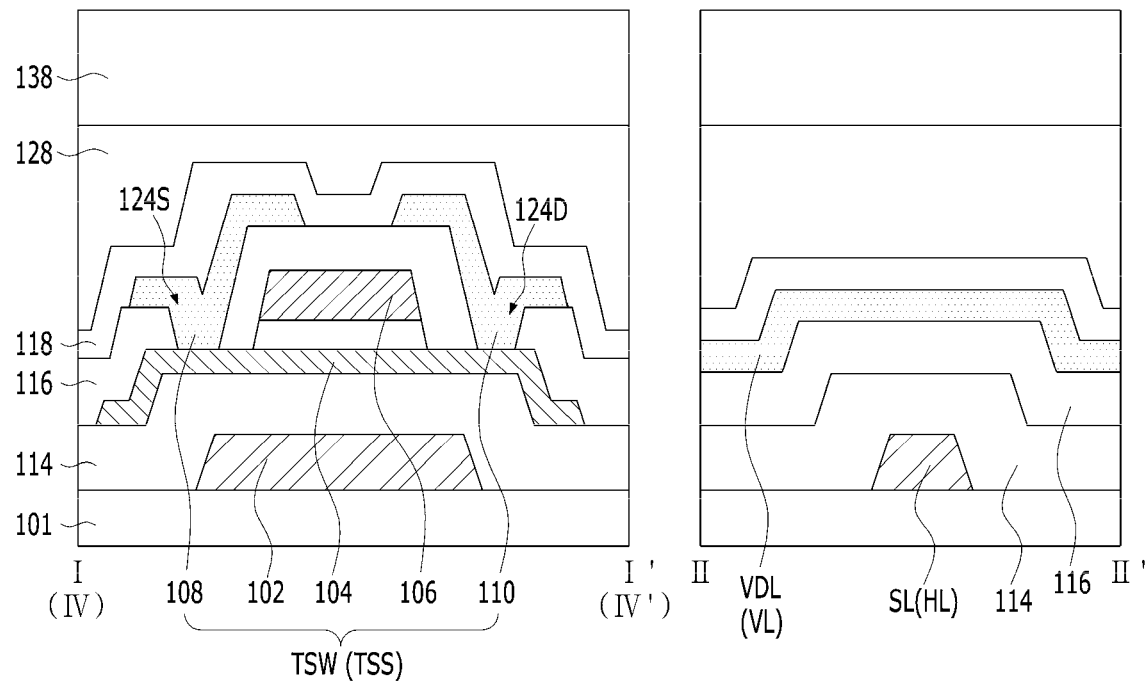
FIG. 6 is a sectional view taken along lines "I-I", "II-II", "III-III", and "IV-IV" of another embodiment of the organic light emitting display device shown in FIG. 3.
Figure 6:
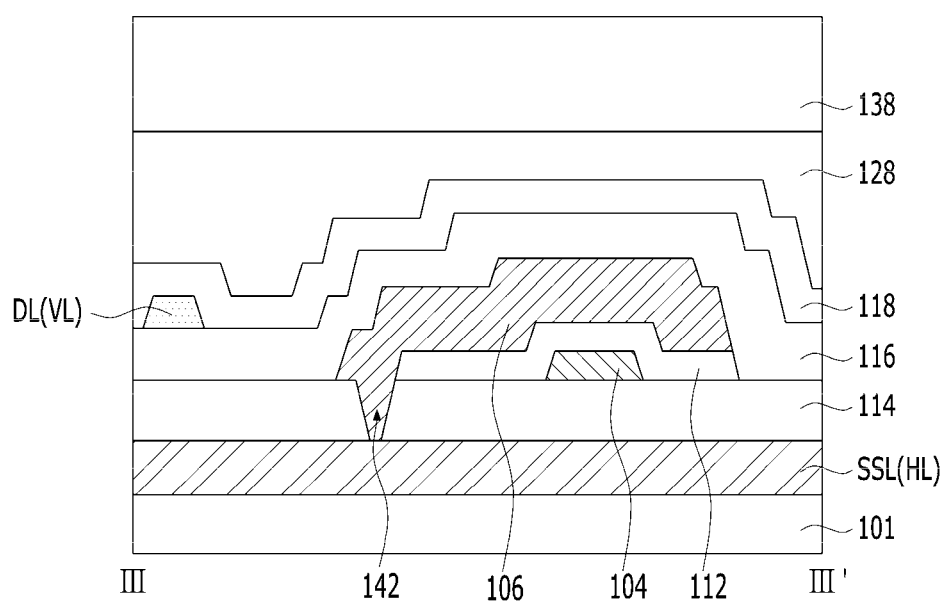

FIG. 6 is a sectional view illustrating an organic light emitting display device according to a second embodiment of the present invention.

Comparing with the organic light emitting display device shown in FIG. 4, the organic light emitting display device shown in FIG. 6 includes the substantially same elements as the organic light emitting display device shown in FIG. 4, except that the first signal line HL formed using the same material as the light-shielding layer 102 on the substrate 101 is directly connected to the gate electrode 106 without any additional connection electrode. Accordingly, detailed description of the same elements is omitted.

The gate contact hole 142 penetrates the buffer film 114 to expose the upper surface of each of the scan line SL and the sensing control line SSL included in the first signal line HL, and the side surface of the gate insulation pattern 112. Accordingly, the gate electrode 106 of the switching thin film transistor TSW is directly connected to the scan line SL exposed through the gate contact hole 142. In addition, the gate electrode 106 of the sensing thin film transistor TSS is directly connected to the sensing control line SSL exposed through the gate contact hole 142.

FIGS. 7A to 7E are sectional views illustrating a method of manufacturing the organic light emitting display device shown in FIG. 6.

Figure 7A:
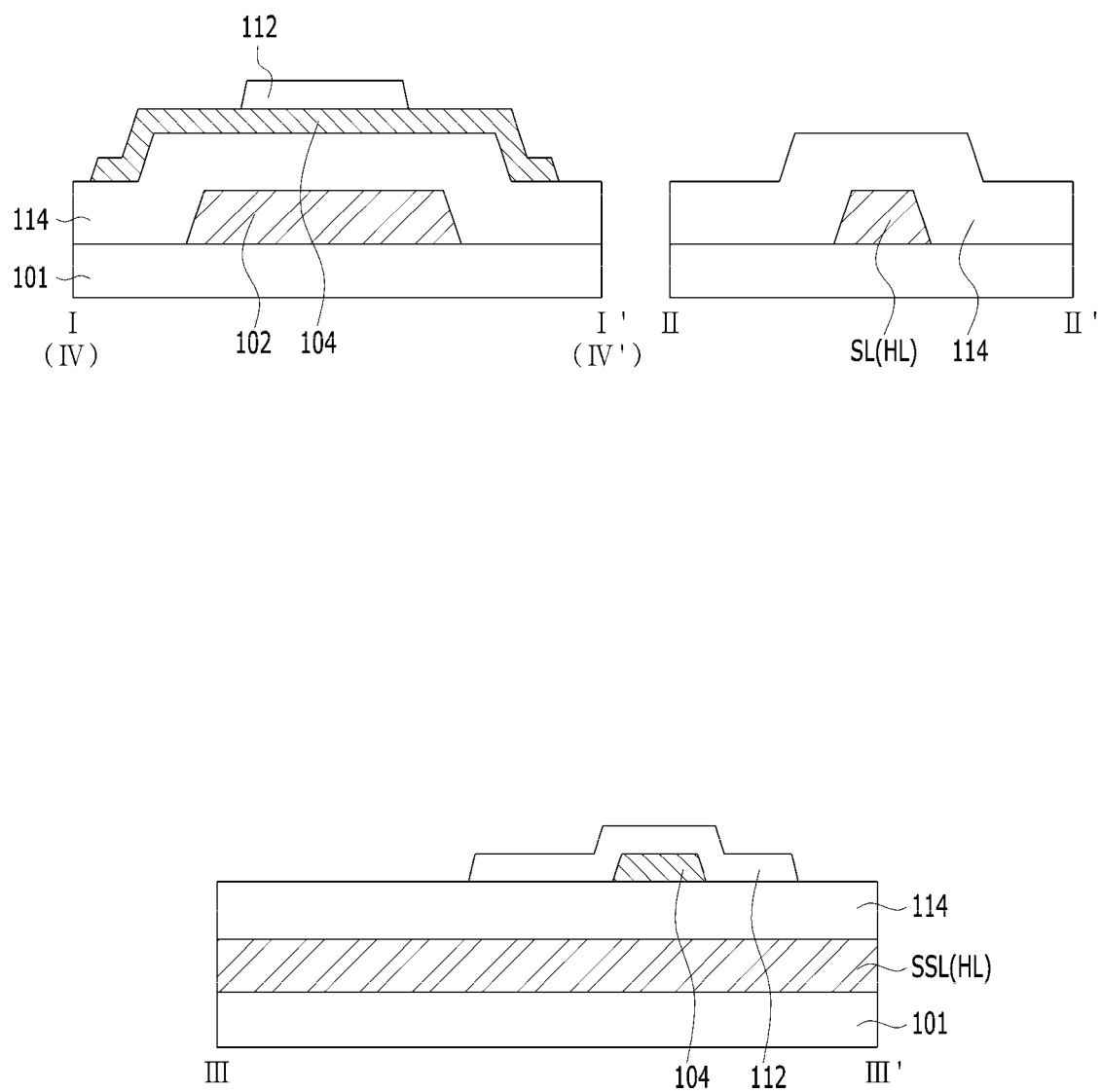
FIGS. 7A to 7E are sectional views illustrating the organic light emitting display device shown in FIG. 6.
Figure 7B:
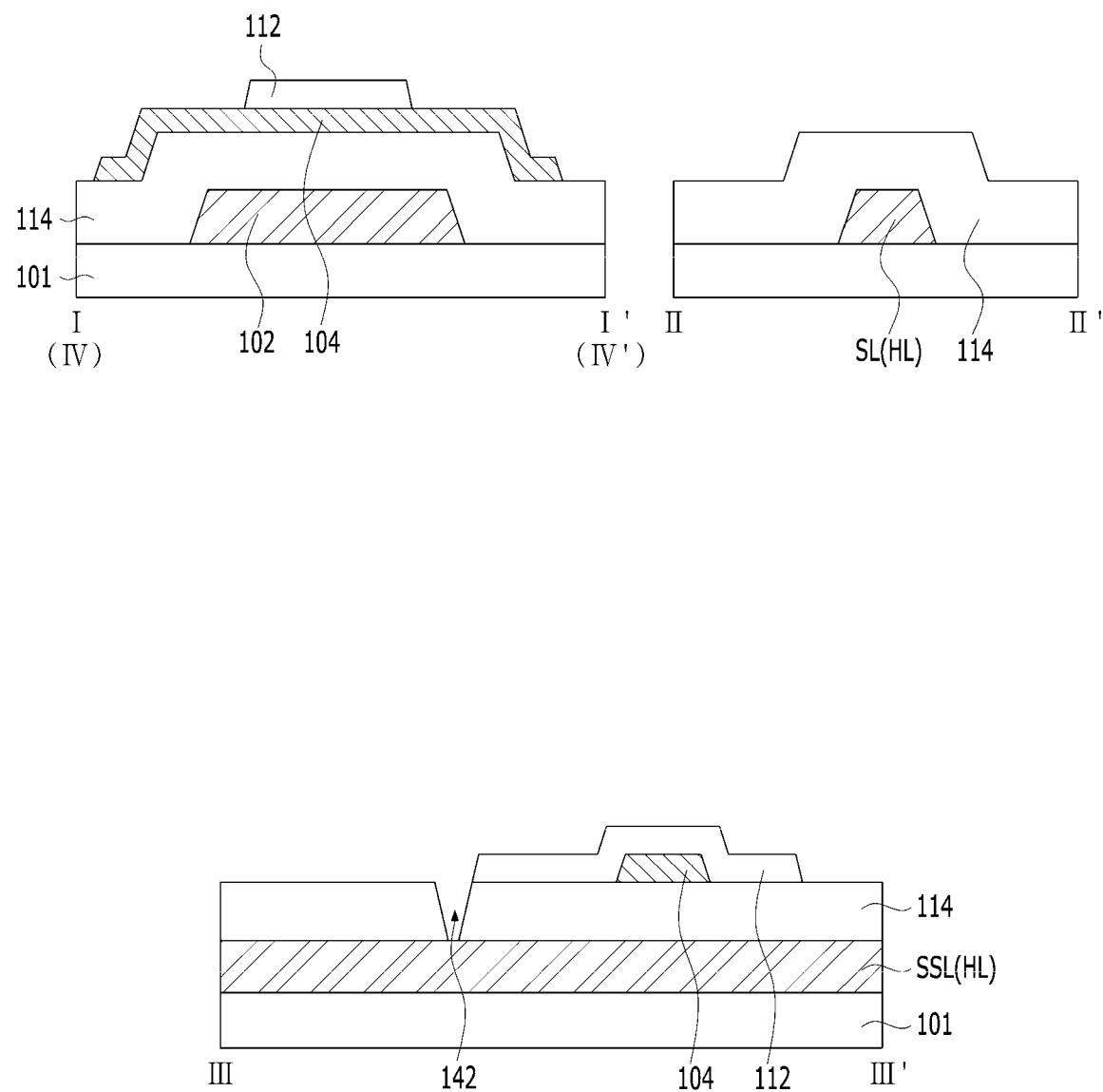
Figure 7C:
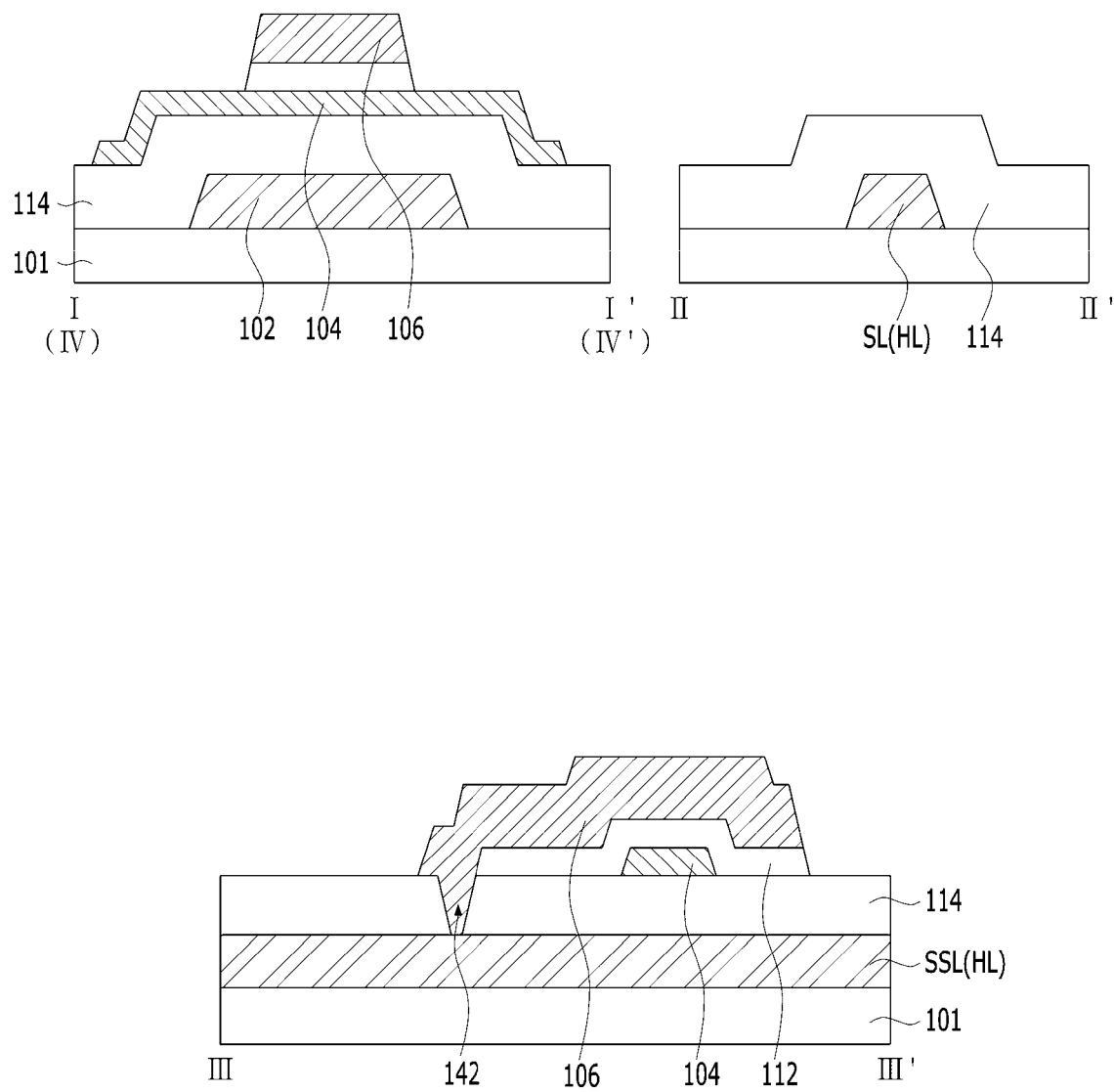
Figure 7D:
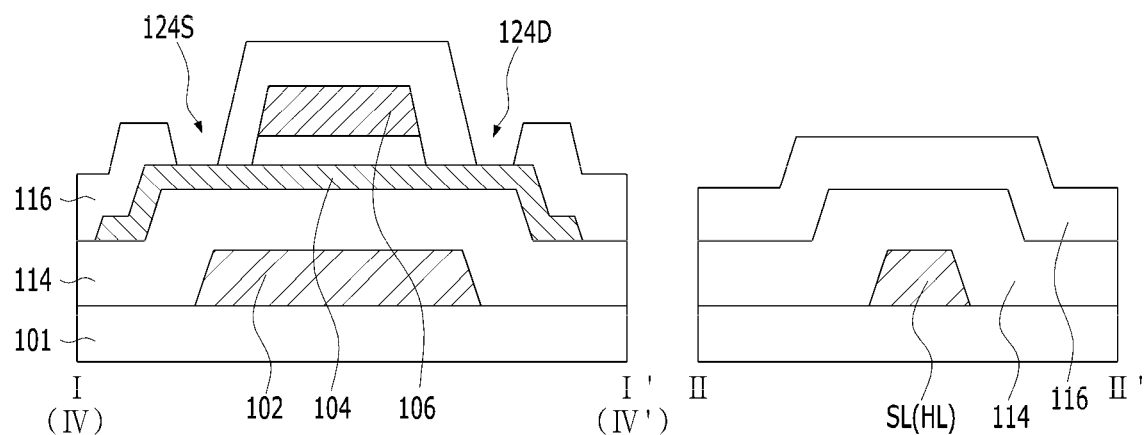
Figure 7D:
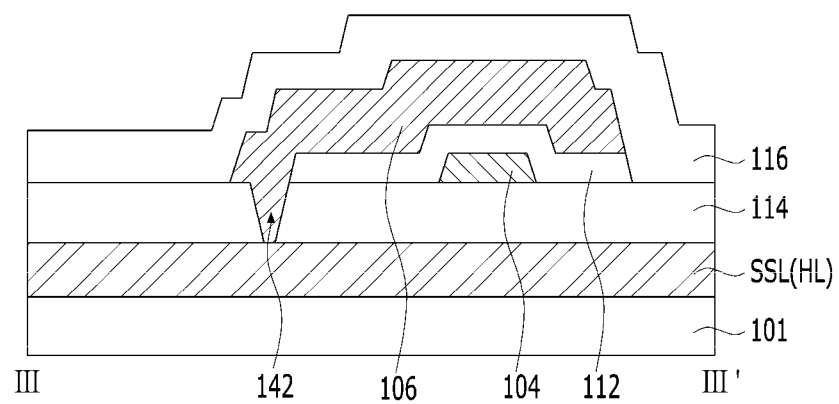
Figure 7E:
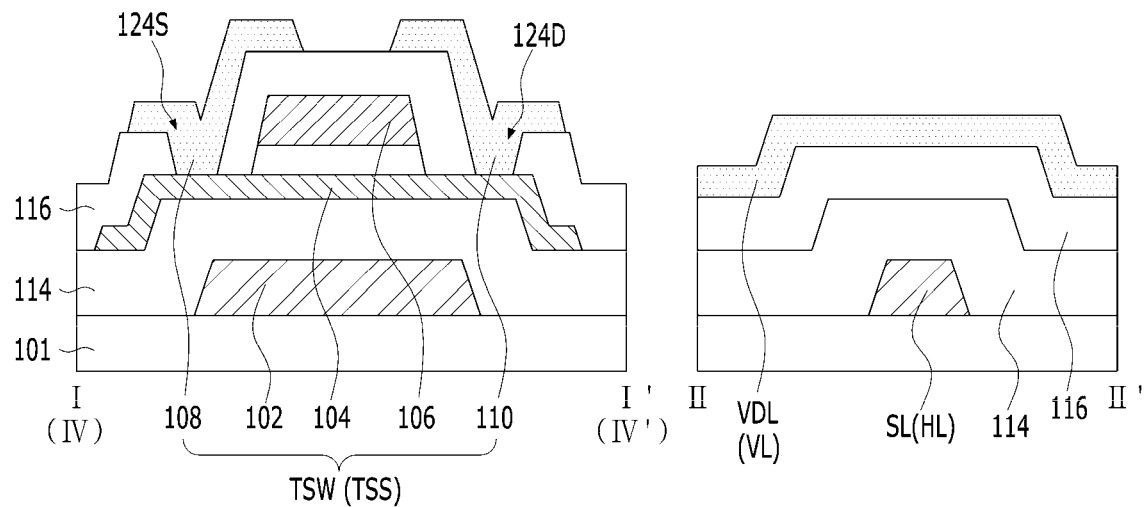
Figure 7E:
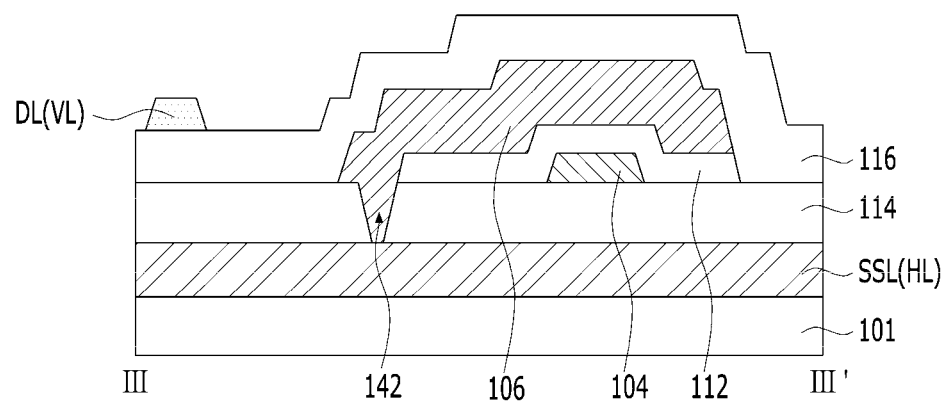

First, a first signal line HL, a light-shielding layer 102, a buffer film 114 and an active layer 104 are formed on the substrate by the aforementioned method shown in FIGS. 5A and 5B. Then, a gate insulation film is formed using an inorganic insulation material such as $SiO_x$ or $SiN_x$ on the substrate 101 provided with the active layer 104, and the gate insulation film is patterned by a photolithographic process and an etching process, thereby forming a gate insulation pattern 112, as shown in FIG. 7A. Then, the buffer film 114 is patterned by a photolithographic process and an etching process to form a gate contact hole 142, as shown in FIG. 7B. Here, the gate contact hole 142 penetrates the buffer film 114 to expose the side surface of the gate insulation pattern 112 and the upper surface of the first signal line HL. Then, a second conductive layer is formed on the substrate 101 provided with the gate contact hole 142 by a deposition method such as sputtering. The second conductive layer is formed as a single layer using a metal material such as Mo, Ti, Cu, AlNd, Al or Cr, or an alloy thereof, or as multiple layers using the same. Then, the second conductive layer is patterned by a photolithographic process and an etching process to form a gate electrode 106, as shown in FIG. 7C. The gate electrode 106 is directly connected to the first signal line HL through the gate contact hole 142. Then, an interlayer insulation film 116 is formed on the substrate 101 provided with the gate electrode 106 by a deposition method such as PECVD. Then, the interlayer insulation film 116 is patterned by a photolithographic process and an etching process to form a source contact hole 124S and a drain contact hole 124D, as shown in FIG. 7D. Then, a third conductive layer is formed on the interlayer insulation film 116 provided with the source contact hole 124S and the drain contact hole 124D. The third conductive layer is formed as a single layer using a metal material such as Mo, Ti, Cu, AlNd, Al or Cr, or an alloy thereof, or as multiple layers using the same. Then, the third conductive layer is patterned by a photolithographic process and an etching process to form a second signal line VL including a data line DL, a low-voltage supply line VSL and a high-voltage supply line VDL, a source electrode 108 and a drain electrode 110, as shown in FIG. 7E. Then, a protective film 118, a planarization layer 128, an anode 132, a bank 138, a light emitting stack and a cathode are sequentially formed on the substrate 101 provided with the second signal line VL, the source electrode 108 and the drain electrode 110.

According to the present invention, the first signal line including the scan line and the sensing control line disposed in the horizontal direction on the substrate contacts the substrate, and the second signal line including the data line, the high-voltage supply line and the low-voltage supply line disposed in a vertical direction is disposed on the insulation film which includes at least two layers and covers the first signal line. Accordingly, the present invention can prevent short-circuit defects between the first and second signal lines, since foreign matter is not created under the first signal line contacting the substrate. In addition, the insulation film including at least two layers is disposed at the intersection of the first and second signal lines, thus increasing the distance between the first and second signal lines and preventing short-circuit between the first and second signal lines.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
   a light emitting element disposed in each sub-pixel area on a substrate;
   a pixel circuit disposed in a circuit area of each sub-pixel area to drive the light emitting element;
   a first signal line disposed on the substrate to contact the substrate, arranged in a first direction, and connected to the pixel circuit;
   a second signal line arranged in a second direction and connected to the pixel circuit; and
   at least two insulation films disposed between the first and second signal lines.

2. The organic light emitting display device according to claim 1, wherein the pixel circuit comprises:
   a driving transistor connected between the light emitting element and a high-voltage supply line;
   a switching transistor connected between a gate electrode of the driving transistor and a data line; and
   a sensing transistor connected between the driving transistor and a reference line,
   wherein the first signal line comprises at least one of a scan line connected to the gate electrode of the switching transistor and a sensing control line connected to the gate electrode of the sensing transistor, and
   the second signal line comprises at least one of the high-voltage supply line, the data line, and a low-voltage supply line connected to the cathode of the light emitting element.

3. The organic light emitting display device according to claim 2, wherein at least two the insulation films comprises:
   a buffer film covering the scan line and the sensing control line; and
   an interlayer insulation film disposed on the buffer film.

4. The organic light emitting display device according to claim 3, further comprising:
   a gate contact hole penetrating the buffer film and the interlayer insulation film to expose an upper surface of the first signal line and the gate electrode; and a connection electrode connecting the first signal line exposed through the gate contact hole to the gate electrode.

5. The organic light emitting display device according to claim 4, wherein the gate contact hole penetrates the buffer film and the interlayer insulation film to expose an upper surface of the scan line and the gate electrode of the switching transistor, and
the connection electrode connects the scan line exposed through the gate contact hole to the gate electrode of the switching transistor.

6. The organic light emitting display device according to claim 4, wherein the gate contact hole penetrates the buffer film and the interlayer insulation film to expose an upper surface of the sensing control line and the gate electrode of the sensing transistor, and
the connection electrode connects the sensing control line exposed through the gate contact hole to the gate electrode of the sensing transistor.

7. The organic light emitting display device according to claim 6, wherein the connection electrode is disposed on the interlayer insulation film using the same material as the data line.

8. The organic light emitting display device according to claim 3, further comprising:
a gate contact hole penetrating the buffer film to expose an upper surface of the first signal line and a side surface of a gate insulation pattern,
wherein the gate electrode is directly connected to the first signal line exposed through the gate contact hole.

9. The organic light emitting display device according to claim 8, wherein the gate contact hole penetrates the buffer film to expose an upper surface of the scan line, and
the gate electrode of the switching transistor is directly connected to the scan line exposed through the gate contact hole.

10. The organic light emitting display device according to claim 8, wherein the gate contact hole penetrates the buffer film to expose the upper surface of the sensing control line, and
the gate electrode of the sensing transistor is directly connected to the sensing control line exposed through the gate contact hole.

11. The organic light emitting display device according to claim 8, wherein the gate insulation pattern is disposed between the gate electrode and the buffer film.

12. The organic light emitting display device according to claim 8, wherein the gate insulation pattern is formed in the same line width as the gate electrode.

13. The organic light emitting display device according to claim 1, wherein the second direction crosses the first direction.

14. An organic light emitting display device, comprising:
a scan line and a sensing control line disposed in a horizontal direction on a substrate such that the scan line and the sensing control line contact the substrate;
at least two insulation films disposed on the scan line and the sensing control line;
a data line, a high-voltage supply line and a low-voltage supply line disposed in a vertical direction on the insulation films;
a pixel circuit connected to the scan line, the sensing control line, the data line, the high-voltage supply line and the low-voltage supply line; and
a light emitting element connected to the pixel circuit.

15. The organic light emitting display device according to claim 14, wherein the pixel circuit comprises:
a driving transistor connected between the light emitting element and the high-voltage supply line;
a switching transistor between the gate electrode of the driving transistor and the data line; and
a sensing transistor connected between the driving transistor and a reference line,
wherein the insulation film comprising at least two layers comprises:
a buffer film covering the scan line and the sensing control line; and
an interlayer insulation film disposed on the buffer film.

16. The organic light emitting display device according to claim 15, further comprising:
a gate contact hole penetrating the buffer film and the interlayer insulation film to expose an upper surface of each of the scan line and the sensing control line, and the gate electrode of each of the switching and sensing transistors; and
a connection electrode connecting the scan line exposed through the gate contact hole to the gate electrode of the switching transistor, and connecting the sensing control line exposed through the gate contact hole to the gate electrode of the sensing transistor,
wherein the connection electrode is formed on the interlayer insulation film using the same material as the data line.

17. The organic light emitting display device according to claim 15, further comprising:
a gate contact hole penetrating the buffer film to expose an upper surface of each of the scan line and the sensing control line,
wherein the gate electrode of the switching transistor is directly connected to the scan line exposed through the gate contact hole, and
the gate electrode of the sensing transistor is directly connected to the sensing control line exposed through the gate contact hole.

* * * * *